United States Patent [19]
Petti et al.

[11] Patent Number: 6,120,693
[45] Date of Patent: Sep. 19, 2000

[54] METHOD OF MANUFACTURING AN INTERLAYER VIA AND A LAMINATE PRECURSOR USEFUL FOR SAME

[75] Inventors: Michael Petti, Buffalo Grove; Gordon C. Smith, Arlington Heights, both of Ill.

[73] Assignee: AlliedSignal Inc., Morristown, N.J.

[21] Appl. No.: 09/187,642

[22] Filed: Nov. 6, 1998

[51] Int. Cl.[7] .................................... G03C 5/00
[52] U.S. Cl. .......................... 216/18; 430/313; 430/317; 430/318; 430/319
[58] Field of Search ................... 428/458, 460, 428/461, 624, 626, 901; 216/18, 39; 430/311, 313, 317, 318, 319

[56] References Cited

U.S. PATENT DOCUMENTS

| 4,024,030 | 5/1977 | Burov et al. ............................ 204/15 |
| 4,448,636 | 5/1984 | Baber ..................................... 156/643 |
| 4,780,177 | 10/1988 | Wojnarowski et al. ................. 216/47 |
| 4,911,785 | 3/1990 | Kittler, Jr. et al. .................... 156/656 |
| 5,207,865 | 5/1993 | Satoh ........................................ 216/18 |
| 5,334,487 | 8/1994 | Kindl et al. ............................. 430/312 |
| 5,354,593 | 10/1994 | Grandmont et al. .................... 428/137 |
| 5,451,721 | 9/1995 | Tsukada et al. ........................ 174/261 |
| 5,672,760 | 9/1997 | Burns et al. ............................ 564/440 |

Primary Examiner—Randy Gulakowski
Assistant Examiner—Anita Alanko
Attorney, Agent, or Firm—McDonnell Boehnen Hulbert & Berghoff

[57] ABSTRACT

A metal-clad laminate product including a carrier film, a release agent layer, a semi-transparent metal layer and a photo dielectric layer deposited on the conductive metal layer and a method for using the metal-clad laminate product to form an interlayer via by exposing at least a portion of an circuit board intermediate prepared from the metal-clad laminate product to light through the semi-transparent metal layer for a period of time sufficient to form an exposed or an unexposed photo dielectric portion and thereafter removing the exposed or unexposed portion of the photo dielectric layer and a corresponding portion of the semi-transparent metal layer overlying the exposed or unexposed portion of the photo dielectric layer to form an interlayer via.

8 Claims, 2 Drawing Sheets

METHOD OF MANUFACTURING AN INTERLAYER VIA AND A LAMINATE PRECURSOR USEFUL FOR SAME

BACKGROUND OF THE INVENTION

1. Field of the Invention

This invention includes a metal-clad laminate product that may be associated with a substrate wherein the metal-clad laminate product includes a semi-transparent metal layer that is thin enough to allow actinic light to penetrate the semi-transparent metal layer and reach into a photo dielectric layer below. This invention also includes a method for manufacturing circuit board having interlayer vias using metal clad laminates including a semi-transparent metal layer.

2. Description of the Related Art

The electronics industry continues to seek enhanced product performance in order to meet consumer demands for higher functionality and lower cost computers and electronics equipment. Among the methods that the electronic industry is using to increase performance is by the design of circuit boards that have smaller, finer circuit lines and spaces. Increasing line density leads to fewer circuit layers resulting in smaller electronic devices. In addition, the industry is also migrating towards built-up technologies using micro-vias. Multi layer circuit boards using dielectric circuit layers connected by very small holes (vias) significantly densify the circuit due to reduced board area per hole.

Current circuit board designs require substrate materials on which extremely fine lines and spaces can be formed with a high degree of precision. Metal foils are generally a preferred substrate for the formation of circuit lines on circuit boards. The metal films are most commonly formed by electrodeposition. Electrodeposited copper films typically must be of a defined minimum thickness, >1 µm, to avoid holes or discontinuities. Metal foils that are currently in use in the industry are typically at least 5 µms in thickness. The use of thinner metal foil in printed circuit board would allow the formation of more densely packed lines and would reduce production costs. Thus, there is a significant interest in developing methods for obtaining thin copper foils. Existing methods for obtaining and placing a very thin metal foil on a laminate are limited. One example of methods for using thin metal layer articles of manufacture to prepare printed circuit board layers is disclosed in U.S. patent application Ser. No. 09/075,732, which is incorporated herein by reference.

Photovia processes, which use photoimageable dielectric materials to fabricate builtup multilayer printed circuit boards, have been developed. In these processes, photo dielectrics are coated on a patterned core and photoimaged to define via holes. The via holes along with the surface of the dielectric layer are then plated with copper. U.S. Pat. No. 5,354,593 sequentially laminates and photoimages two photo dielectrics onto a conductive core to define via holes and then copper plates the via holes. U.S. Pat. No. 5,451,721 produces a multilayer printed circuit board by applying a photosensitive resin layer onto a core having a metal line on its surface. After imaging to form vias, the resin layer is deposited with a copper layer by electroless plating techniques. U.S. Pat. No. 5,334,487 produces a patterned layer on a substrate by applying and exposing different photosensitive compositions on opposite sides of a copper foil. One side is developed and the copper etched, followed by developing the other side and metallization of through holes. U.S. Pat. Nos. 5,354,593, 5451,721 and 5,334,487 are each incorporated herein by reference.

Current high density built-up technologies largely depend on via holes and dielectric layers metallized by sputter metal deposition or electroless seeding. Via formation can occur by reactive ion etching, photolithography in the case of photo reactive dielectrics, wet etching, or projection ablation. Photo dielectrics are becoming the most attractive approach due to their fit with current printed wiring board equipment. The subsequent metal layer, being sputtered or electroless deposited, is applied as a seed layer for pattern plating or panel plating circuit formation. Sputter deposition is preferred due to the dry processing, but current printed wiring board infrastructure does not contain sputtering technology, and the technology is limited to small printed wiring boards. Examples of methods and articles of manufacture useful for preparing circuit boards including interlayer vias are disclosed in U.S. patent application Ser. Nos. 09/054,264, and 09/054,263 each of which are incorporated herein by reference. Electroless seeding is possible in many board processes, but the steps require board exposure to severe a pH wet process and give seed layers of poor uniformity, with low conductivity and residual metals trapped within the dielectric after etching. As a result, there is a need for technology that enables via formation with high density circuits that fits many of the current wiring board processes.

BRIEF SUMMARY OF THE INVENTION

An object of the present invention is to provide a metal-clad laminate for use in manufacturing printed circuit boards including interlayer vias.

Another object of the present invention is to provide a method for manufacturing a prepeg and/or circuit board including at least one interlayer via that uses a single photo imaging step.

The present invention involves a metal-clad laminate product that includes a carrier film having a first surface and a second surface, a release agent layer covering the carrier film first surface, a conductive metal layer including at least one conductive metal deposited onto the release agent layer and having a thickness of from about 50 to about 3000 angstroms, a photo dielectric layer, and an optional adhesion layer deposited on the conductive metal layer.

The present invention also involves a method of manufacturing an interlayer via. The interlayer via is made by preparing a circuit board intermediate that includes (1) a substrate; (2) a photo dielectric layer deposited on the substrate; (3) an semi-transparent metal layer; and (4) at least one embedded circuit. The interlayer via is formed by exposing at least a portion of the circuit board intermediate to light through the semi-transparent metal layer for a period of time sufficient to form an exposed photo dielectric portion and an unexposed photo dielectric portion. Following a single exposure to a light source the exposed or unexposed portion of the photo dielectric layer and a corresponding portion of the semi-transparent metal layer overlying the exposed or exposed portion of the photo dielectric layer is removed to form a via.

DETAILED DESCRIPTION OF THE INVENTION

Figure 1A:
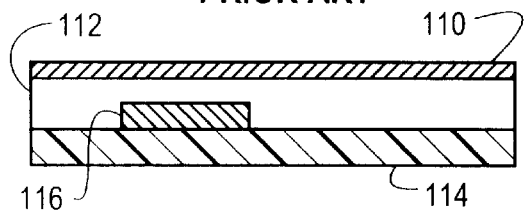
FIGS. 1A, 1B, 1C, 1D, and 1E depict a cross-sectional illustration of a circuit board intermediate product during the steps of a prior art method for manufacturing a circuit including interlayer vias.
Figure 1B:
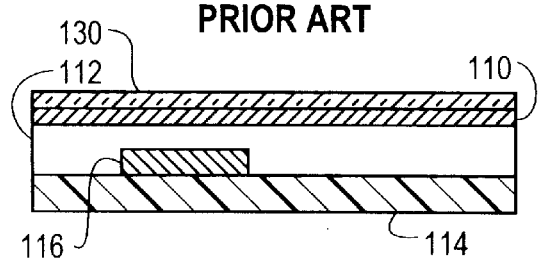
Figure 1C:
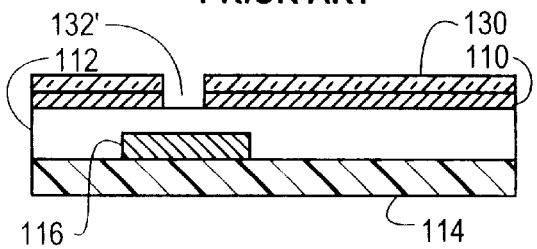
Figure 1D:
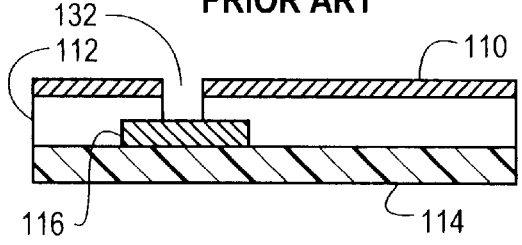
Figure 1E:
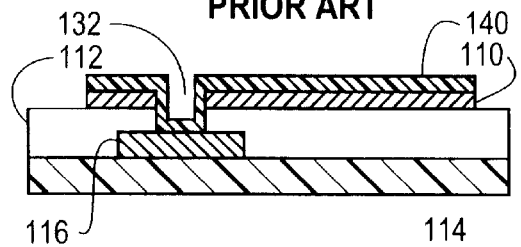

FIG. 1 depicts steps of a prior art method for manufacturing a printed circuit board including at least one embedded circuit. The method, which is described in detail in U.S. patent application Ser. Nos. 09/054,263 and 09/054,264, which are incorporated herein by reference, begins with a layered laminate, shown in FIG. 1A, including a conductive metal layer 110, a photo dielectric layer 112, a base layer 114, and at least one embedded circuit 116. A resist layer 130 is applied to the conductive metal layer as shown in FIG. 1B. The resist layer 130 is exposed to actinic light and resist layer 130 is developed to expose portions of conductive metal layer 110. The exposed conductive metal layer 110 is etched from the substrate to give a partial via 132' as shown in FIG. 1C. In the case of positive acting photo dielectric materials, the laminate is exposed a second time to actinic light to soften the photo dielectric layer portion located in partial via 132' after which the exposed photo dielectric layer portion is removed to form via 132 that exposes at least a portion of embedded circuit 116 as shown in FIG. 5C. Finally, An interconnect 140 is applied to via 132 and conductive metal layer 110 by panel or pattern plating methods known in the art in order to electrically unite embedded circuit 116 with conductive metal layer 110.

Figure 4:
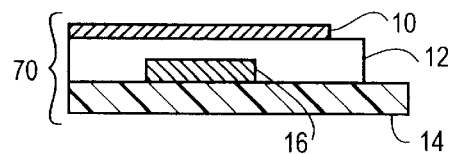
FIG. 4 is a cross-sectional illustration of a circuit board intermediate product that results from the combination of the two layers depicted in the FIG. 2.

FIG. 4 depicts a circuit board intermediate product that is useful for manufacturing interlayer vias. The circuit board intermediate product comprises a semi-transparent metal layer 10, which is associated with a photo dielectric layer 12, which in turn rests upon a base 14. The intermediate product includes at least one integral circuit 16 consisting of a conductive material such as a metal.

Figure 2:
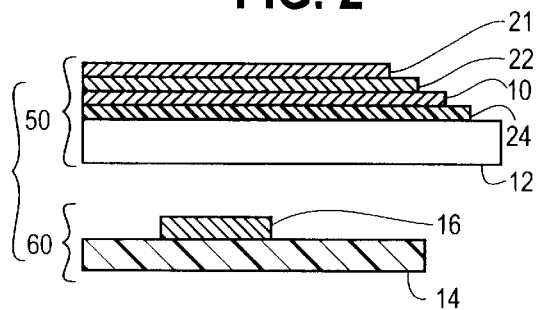
FIGS. 2 and 3 are cross-sectional illustrations of a metal clad laminate product and a circuit board precursor substrate including at least one embedded circuit prior to the union of the two layers.
Figure 3:
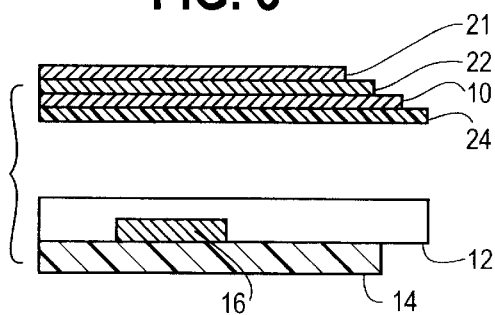

FIG. 2 is a cross-section of a metal-clad laminate products useful for manufacturing the intermediate product shown in FIG. 4. Metal clad laminate 50 is located above substrate 60 which includes a base layer 14 and at least one embedded circuit 16. Metal clad laminate 50 includes a polymer or metal foil carrier layer 21, a polymeric release agent layer 22 formed on the carrier film, and a semi-transparent metal layer 10 formed on release agent layer 22. Metal-clad laminate 50 may optionally include an adhesion layer 24 that facilitates adhesion of the metal-clad laminate 50 to photo dielectric layer 12. Alternatively, photo dielectric layer 12 may be pre applied to base 14 of substrate 60 such that photo dielectric layer 12 covers at least one embedded circuit 16. This alternative embodiment is depicted in FIG. 3.

Preferably, carrier layer21 comprises a flexible, dimensionally stable material with good tear and chemical resistances. Carrier layer 21 should be tolerant to above-ambient temperatures. Preferably, carrier layer 21 is made of a material having low absorbed moisture and residual solvent, because water and solvents can interfere with the metallization step. Suitable materials include polymeric film or metal foils. A metal foil is preferred because metal foils tend to have high tensile strength at elevated temperatures, low absorbed moisture, and low residual solvent.

Carrier layer 21 is preferably electroplated copper foil or a polyimide film. Other metal foils that would make suitable carrier films include rolled or electrodeposited metal and metal alloys including steel, aluminum (AllFoils available from Alcoa), and copper available from Gould Inc., and Oak Mitsui Inc. It is expected that certain polymeric films would be suitable for the practice of the present invention. Examples of suitable polymeric films include polyesters such as polyethylene terephthalate, poly-butylene terephthalate and polyethylene naphthalate (Kaladex® available from ICI America), polypropylene, polyvinyl fluoride (Tedlar® available from DuPont), polyimide (Kapton® available from DuPont; Upilex® available from UBE Industries), and nylon (Capran® available from AlliedSignal).

Release agent layer 22 is used to facilitate removal of carrier layer 21 from semi-transparent metal layer 10. In order to avoid the problem of picking, which results in incomplete transfer of semi-transparent metal layer 10 to the substrate under lamination, the release agent layer 22 is designed to peel at the interface between release agent layer 22 and carrier layer 21. Release agent layer 22 is subsequently removed from semi-transparent metal layer 10 with the aid of plasma, an oxidizing environment, intense light, or an appropriate solvent. Preferably, release agent layer 22 is removed by washing with a solvent, most preferably an aqueous solution. In methods that lack a release agent layer, and in methods that employ a release agent layer that peels at the interface between the parting layer and the semi-transparent metal layer, incomplete transfer of the metal of the semi-transparent metal layer to the substrate commonly occur.

Release agent layer 22 is made of a polymeric material. Preferably, the release agent is an aqueous-soluble material to facilitate its convenience removal from semi-transparent metal layer 10. Because photo resists are developed in an alkaline environment, it would be most preferable to use a release agent that is soluble in an aqueous alkaline solution. A useful polymer is one that is of a good film-forming material. The polymer can be coated from water with the aid of a volatile base such as ammonium hydroxide to aid solubility. Optionally, the release agent comprises a water-soluble surfactant to improve solution wetting properties, and to control drying defects.

A preferred release agent is applied as a formulation comprising a polyvinylpyrrolidone (PVP) polymer, a surfactant, and water. It is expected that formulations containing PVP in the range of from about 1% PVP to about 50% PVP, and surfactant in the range of from about 0% surfactant to about 5% surfactant are suitable for the practice of the present invention. Preferred PVPs for use in the present invention have a molecular weight in the range of about 10,000 to about 5,000,000. It is reasonable to expect that a release agent layer comprising a polymer such as acid modified acrylic polymers, acrylic copolymers, urethanes, and polyesters, carboxylic acid functional styrene acrylic resins (S. C. Johnson Wax, Joncryl®), polyvinyl alcohols (Air Products & Chemicals, Airvol®), and cellulose based polymers could be successfully employed in the practice of the present invention. Other suitable water soluble surfactants that are useful as the release agent layer of the present invention include alkylarylpolyether alcohols (Rohm & Haas, Triton® X100), glycerin, ethoxylated castor oil (CasChem Inc., Surfactol® 365), and fluoroaliphatic polymeric esters (3M Corporation, Fluorad® 430). The release agent formulation is applied in an amount sufficient to achieve a dry weight of from about 10 mg/ft$^2$ to about 1000 mg/ft$^2$, about 0.1 $\mu$m to 10 $\mu$m. Preferably, the release agent formulation is applied in an amount sufficient to achieve a layer of about 1 $\mu$m to 4 $\mu$m in thickness with a dry weight of from about 100 mg/ft$^2$ to about 400 mg/ft$^2$.

Release agent layer 22 is applied to carrier layer 21. Onto exposed release agent layer 22 is deposited an semi-transparent metal layer 10. Semi-transparent metal layer 10 may be manufactured out of a single layer of conductive metal or out of multiple layers of conductive metals or alloys. Regardless of the number of layers used, it is important that semi-transparent metal layer 10 is thin enough to be semi-transparent, i.e., thin enough to allow at least some light to pass through the semi-transparent metal layer 10 and into contact with photo dielectric layer 12. We have determined that a semi-transparent metal layer 10 having a thickness of from 10 Angstroms to about 3000 Angstroms is sufficiently thin to allow light to penetrate through the semi-transparent metal layer 10 and into photo dielectric layer 12. However, in order to insure that the light is transmitted through semi-transparent metal layer 10 at an intensity sufficient to quickly react with the photo dielectric layer 12, it is preferred that semi-transparent metal layer 10 has a thickness of from about 50 to about 1000 Angstroms and most preferably, a thickness of from about 100 to about 750 Angstroms.

Semi-transparent metal layer 10 may consist entirely of a thin primary conductive layer which is deposited onto release agent layer 22 by sputtering using a Desk III sputtering unit. It is expected that any sputtering or vapor deposition method known in the art may be successfully used in this invention. Semi-transparent metal layer 10 is preferably manufactured of gold, chrome, copper, or alloys thereof. Other suitable metals may include, but not limited to, tin, nickel, aluminum, titanium, zinc, chromium-zinc alloy, brass, bronze, and alloys of the same. Semi-transparent metal layer 10 may optionally be made from a mixture of suitable metals or non-metal conductive and non-conductive materials.

Optionally, semi-transparent metal layer 10 may include a primary metal layer and a secondary metal layer with the secondary metal layer 10 being used to protect the primary layer from oxidation, to increase adhesion during lamination, or to act as a barrier to metal migration. To form the optional secondary metal layer, a layer of zinc, indium, tin, cobalt, aluminum, chrome, nickel, nickel-chrome, brass, or bronze are alloys thereof is deposited on the first metal layer. Other suitable metals include magnesium, titanium, manganese, bismuth, molybdenum, silver, gold tungsten, zirconium, antimony, and chromium-zinc alloys. The secondary metal layer prevents the metal in the first metal layer from oxidizing after removal from the metallizing chamber, and increases adhesion to thermosetting resin systems. The total thickness of the primary and secondary metal layers of the semi-transparent metal layer must not exceed 3000 Angstroms, and preferably not greater than about 1000 Angstroms and most preferably not exceed 750 Angstroms.

An optional adhesion layer 24 can be applied to the semi-transparent metal layer 10. Adhesion layer 24 is used to increase the bond between the metal layers and the substrate layers following lamination. Optional adhesion layer 24 may be organic, organometallic, or inorganic compounds, and applied to a thickness of 0.0005 $\mu$m (5 Angstroms) to 10 $\mu$m (100,000 Angstroms). Multiple layers may be used such as an organometallic layer followed by an organic layer. Typically when an organometallic layer is used, such as a silane, the coating will be from 0.0005 $\mu$m (5 Angstroms) to 0.005 $\mu$m (500 Angstroms) in thickness. When using organic adhesion layers, such as thermoplastics, thermosetting polymers, or mixtures, the coating would be 0.1 $\mu$m (1000 Angstroms) to 10 $\mu$m (100,000 Angstroms) in thickness. The organic adhesion layer should be chosen so as to be soluble in the solvent used to develop the photo dielectric layer.

According to FIG. 2, substrate 60 includes a base layer 14 on which is located at least one exposed embedded circuit 16. Base 14 may be any material useful in manufacturing printed circuit boards. Typically, the substrate base consists of a dielectric material such as a thermoplastic or thermoset film; composites with glass, ceramic, or organic reinforcement; or ceramics or metals.

Photo dielectric layer 12 may be any negative acting or positive acting resin system when exposed to an actinic light source. Examples of useful photo dielectric materials include epoxies, polyimides, and acrylate based resins. Compositions disclosed in U.S. Pat. No. 5,672,760 are useful and incorporated herein by references. Commercially available dielectric chemistries include Probelec™91 (liquid available from Ciba Geigy) and ViaLux™81 (film available from DuPont), XP-9500 (available from Shipley, Probelec® XB-7081 (available from Ciba Specialty Chemicals), and Type AE-15 (available from Morton Electronic Materials).

Suitable negative working photo dielectric compositions include photopolymerizable compositions which comprise at least one photopolymerizable compounds containing at least two olefinically unsaturated double bonds, such as acrylates, plus a free radical photoinitiator. Other negative working photoimageable compositions may be produced by admixing a photoacid generator capable of generating an acid upon exposure to actinic radiation with a polymer precursor such as an epoxy precursor, which forms polymers upon contact with the generated acid together with an optional, but preferred, organic acid anhydride monomer or polymer and an optional but preferred phenol-containing monomer or polymer. A combination of both types of working photosensitive dielectric compositions is also within the purview of the invention.

Such photopolymerizable compounds containing at least two olefinically unsaturated double bounds are well known in the art. Suitable for use as polymerizable compounds are ethers, esters and partial esters of acrylic and methacrylic acid and aromatic and aliphatic polyols containing preferably 2 to 30 carbon atoms, or cycloaliphatic polyols containing preferably 5 or 6 ring carbon atoms. These polyols can also be modified with epoxides such as ethylene oxide or propylene oxide. The partial esters and esters of polyoxyalkylene glycols are also suitable. Examples are ethylene glycol dimethacrylate, diethylene glycol dimethacrylate triethylene glycol dimethacrylates having an average molecular weight in the range from 200 to 2000, ethylene glycol diacrylate, diethylene glycol diacrylate, triethylene glycol diacrylate, tetraethylene glycol diacrylate, polyethylene glycol diacrylates having an average molecular weight in the range from 200 to 2000, trimethylolpropane ethoxylate trimethacrylate, trimethylolpropane polyethoxylate trimethacrylates having an average molecular weight in the range from 500 to 1500, trimethylolpropane ethoxylate triacrylates having an average molecular weight in the range from 500 to 1500, pentaerythritol diacrylate, pentaerythritol triacrylate, dipentaerythritol tetraacrylate, dipentaerythritol pentaacrylate, dipentaerythritol hexaacrylate, tripentaerythritol ocataacrylate, pentaerythritol dimethacrylate, pentaerythritol trimethacrylate, dipentaerythritol diemthacrylate, diepentaerythritol tetramethacrylate, tripentaerythritol octamethylacrylate, 1,3-butanediol dimethacrylate, sorbitol triacrylate, sorbitol tetraacrylate, sorbitol tetramethacrylate, sorbitol pentaacrylate, sorbitol hexaacrylate, oligoester acrylates, oligoester methacrylates, glycerol di- and triacrylate, 1,4-cyclohexane diacrylate, bisacrylates and bismethacrylates or polyethylene glycols having an average molecular weight from 100 to 155, ethylene glycol diallyl ether, 1,1,1-trimethylolpropane triallyl ether, pentaerythritol triallyl ether, diallyl succinates and diallyl adipates or mixtures of the above compounds. Preferred multifunctional acrylate oligomers include, but are not limited to acrylated epoxies, acrylated polyurethanes, and acrylated polyesters. The photopolymerizable compound is present in an amount sufficient to photopolymerize upon exposure to sufficient actinic radiation. In the preferred embodiment, the multifunctional photopolymerizable compound is present in the overall compositions in an amount of from about 1% to about 80% by weight, preferably from about 20% to about 70% based upon the non-solvent parts of the overall radiation sensitive composition.

When photopolymerizable compositions are used they contain at least one free radical generating component which photolytically generates free radicals. Examples of free radical generating components include photoinitiators which themselves photolytically generate free radicals by fragmentation or Norrish type 1 mechanism. These latter have a carbon-carbonyl bond capable of cleavage at such bond to form two radicals, at least one of which is capable of photoinitiation. Suitable initiators include aromatic ketones such as benzophenone, acrylated benzophenone, 2-ethylanthraquinone, phenanthraquinone, 2-tert-buthylanthraquinone, 1,2-benzanthraquinone, 2,3-benzanthraquinone, 2,3-dichloronaphthoquinone, benzyl dimethyl ketal and other aromatic ketones, e.g. benison, benzoin ethers such as benzoin methyl ether, benzoin ethyl ether, benzoin isobutyl ether and benzoin phenyl ether, methyl benzoin, ethyl benzoin and other benzoins; diephenyl-2,4,6-trimethyl benzoylphosphine oxide; and bis (pentafluorophenyl) titanocene. The free radical generating component may comprise a combination of radical generating initiators which generate free radicals by Norrish type 1 mechanism and a spectral sensitizer. Such a combination includes 2-methyl-1-4'-(methylthio)-2-morpholinopropiophenone available from Ciba Geigy as Irgacure 907 in combination with ethyl Michler's ketone (EMK) which is 4,4'-bisdiethylaminobenzophenone; Irgacure 907 in combination with 2-isopropylthioxanthanone (ITX); benzophenone in combination with EMK; benzophenone in combination with ITX; 2-benzyl-2-N, N-dimethylamino-1-(4-morpholinophenyl)-1-butanone which is available from Ciba-Geigy as Irgacure 369 in combination with EMK; Irgacure 369 in combination with ITX. In such cases, it is preferred that the weight ratio of radical generating photoinitiator and spectral sensitizer ranges from about 5:1 to about 1:5. Other radical generators useful for this invention non-exclusively includes triazines, such as chlorine radical generators such as 2-substituted-4, 6-bis(trihalomethyl)-1,3,5-triazines. The foregoing substitution is with a chromophore group that imparts spectral sensitivity to the triazine to a portion of the electromagnetic radiation spectrum. Non-exclusive examples of these radical generators include f2-(4-methoxynaphth-1-yl)-4,6-bis (trichloromethyl)-1,3,5-triazine; 2-(4-methylthiophenyl)-4, 6-bis(trichloromethyl)-1,3,5-triazine; 2-(4-methoxystyrl)-4, 6-bis(trichloromethyl)-1,3,5-triazine; 2-(4-diethylaminophenyl-1,3-butadienyl)-4, 6-bis (trichloromethyl)-1,3,5-triazine; 2-(4-diethylaminophenyl-1,3-butadienyl)-4,6-bis(trichloromethyl)-1,3,5-triazine, among others. Also useful for the invention are Norrish type II mechanism compounds such as combinations of thioxanthones such as ITX and a source of abstractable hydrogen such as triethanolamine. The free radical generating component is present in an amount sufficient to effect photopolymerization of the photopolymerization compound upon exposure to sufficient actinic radiation. The photoinitiator may comprise from about 1% to about 50% of the non-solvent parts of the overall composition, or more preferably from about 2% to about 40% and most preferably from about 5% to about 25%.

The negative working photoimageable compositions may also be produced by admixing a photoacid generator capable of generating an acid upon exposure to actinic radiation, with polymer precursors, such as epoxy precursors, which form polymers upon contact with the generated acid. The photoacid generator that may be used herein is one which generates an acid upon exposure to actinic radiation such as ultraviolet radiation. Photoacid generators are known in the photoimaging art and include, but are not limited to, onium compounds such as aryl derivatives of sulfonium, iodonium and diazonium salts, and organic compounds with photolabile halogen atoms. Preferred photoacid generators include triarylsulfonium and diaryliodonium salts with hexafluorophosphate, hexafluoroantimonate, hexafluoroarsenate, and tetrafluoroborate anions. Non-limiting examples of suitable iodonium salts are salts of diephenyliodonium, dinaphthyliodonium, di(4-chlorophenyl)iodonium, tolyl(dodecylphenyl)iodonium, naphthylphenyliodonium, 4-(tri-fluoromethylphenyl) phenyliodonium, 4-ethylphenyl-phenyliodonium, di(4-acetylphenyl)iodonium, tolylphenyliodonium, 4-butoxyphenylphenyliodonium, di(4-phenylphenyl) iodonium, and the line. Di-phenyliodonium salts are preferred. Non-limiting examples of suitable sulfonium salts are salts of triphenylsulfonium, dimethylpheylsulfonium, 4-butoxyphenyldiphenylsulfonium, and 4-acetoxy-phenyldiphenylsulfonium. Tri-phenylsulfonium salts are preferred. Organic compounds with photolabile halogen atoms include alpha-hal-p-nitrotoluenes, alpha-halomethyl-s-triazines, carbon tetrabromide, and the like. These acid generators may be used singly or in combination of two or more thereof. The photoacid generator component is preferably present in an amount of from about 0.05% to about 20% of the total weight of the nonsolvent parts of the compositions, more preferably from about 0.2% to about 10%, and most preferably from about 0.5% to about 5% by weight of the nonsolvent parts of the composition.

Suitable polymer precursors include epoxy precursors, for example, the diglycidyl ethers of resorcinol, catechol, hydroquinone, biphenol, bisphenol A, bisphenol F, bisphenol K, tetrabromobisphenol A, phenol-formaldehyde novolac resins, alkyl substituted phenol-formaldehyde resins, phenol-hydroxybenzaldehyde resins, cresol-hydroxybenzaldehyde resins, dicyclopentadiene-phenol resins, dicyclopentadiene-substituted phenol resins tetramethylbiphenol, tetramethyl-tetrabromobiphenol, any combination thereof and the like. Also suitable are the alkylene oxide adducts of compounds of more than one aromatic hydroxyl group per molecule such as the ethylene oxide, propylene oxide, or butylene oxide adducts of dihydroxy phenols, biphenols, bisphenols, halogenated bisphenols, alkylated bisphenols, trisphenols, phenol-aldehyde novolac resins, halogenated phenol-aldehyde novolac resins, alkylated phenolaldehyde novolac resins, halogenated phenol-aldehyde novolac resins, alkylated phenolaldehyde novolac resins, phenol-hydroxybenzaldehyde resins, cresol-hydroxybenzaldehyde resins, any combination thereof and the like. Also suitable are the glycidyl ethers of compounds having an average of more than one aliphatic hydroxyl group per molecule such as aliphatic polyols and polyether polyols. Non-limiting examples include polyglycidyl ethers of polyethylene glycols, polypropylene glycols, glycerol, polyglyercerols, trimethylolpropane, butanediol, sorbitol, pentaerythritol, and combinations thereof. The epoxy precursor component is preferably present in amount of from about 10% to about 90% more preferably from about 20% to about 80% and most preferably from about 35% to about 65% by weight of the nonsolvent parts of the compositions. Optionally the negative working photosensitive dielectric compositions can comprise a mixture of both an acrylate and an epoxy type composition as described above. The composition then preferably contains an optional organic acid anhydride monomer or polymer curing agent component. Nonlimiting examples of suitable anhydrides including styrene-maleic anhydride, styrene-alkyl methacrylate-itaconic anhydride, methyl methacrylate-butyl acrylate-itaconic anhydride, butyl acrylate-styrene-maleic anhydride, and the like. Preferred are styrene-maleic anhydride polymers with styrene to maleic anhydride molar ratio of from about 1:1 to about 3:1. Also suitable are dodecenyl succinic anhydride, trimellitic anhydride, chloroendic anhydride, phthalic anhydride, methylhexahydrophthalic anhydride, 1-methyl tetrahydrophthalic anhydride, hexahydrophthalic anhydride, methylnadic anhydride, methylbutenyltetrahydrophthalic anhydride, benzophenone terracarboxylic dianhydride, methylcyclohexendiacrboxylic anhydride. These acid anhydrides may be used singly or in combination of two or more thereof. This anhydride component is preferably present in the composition in an amount of from about 0.5% to about 90%, more preferably present in the composition in an amount of from about 0.5% to about 90%, more preferably from about 1% to about 80% and most preferably from about 2% to about 6% by weight of the nonsolvent parts of the composition. The composition then contains an optional aromatic hydroxyl containing compounds such as a phenolic monomer or polymer or mixture thereof. Suitable aromatic hydroxyl containing compounds which can be employed herein include, for example, compounds having an average of more than one phenolic hydroxyl group per molecule. Suitable such compounds include, for example, dihydroxy phenols, bi-phenols, bisphenols, halogenated bisphenols, alkylated bisphenols, trisphenols, phenol-aldehyde resins, halogenated phenol-aldehyde novolac resins, alkylated phenol-aldehyde novolac resins, phenol-hydroxybenzaldehyde resins, alkylated phenol-hydroxybenzaldehyde resins, the ethylene oxide, propylene oxide, or butylene oxide adducts of dihydroxy phenols, biphenols, bisphenols, halogenated bisphenols, alkylated bisphenols, trisphenols, phenol-aldehyde novolac resins, halogenated phenol-aldehyde novolac resins, alkylated phenol-aldehyde novolac resins, cresol-aldehyde novolac resins, phenol-hydroxybenzaldehyde resins, cresol-hydroxybenzaldehyde resins, vinyl phenol polymers, any combination thereof and the like. When phenol containing compounds or polymers are used, it is preferably present in an amount of from about 0.5% to about 90%, more preferably from about 1% to about 80%, and most preferably from about 2% to about 60% based on the weight of the nonsolvent parts of the composition.

Optionally, the photosensitive dielectric composition may comprise a curing catalyst such as a thermal curing catalyst, for example, tertiary amines, imidazoles phosphines. The thermal curing catalyst may be present in an amount of from about 0.01% to about 10%, more preferably from about 0.02% to about 5% and most preferably from about 0.5% to about 2% by weight of the nonsolvent parts of the photosensitive dielectric composition.

The components of the photo dielectric composition may be mixed in any suitable medium solvent and coated onto the conductive foil by any convenient means. Solvents which can be used in preparing the photo dielectric composition of this invention include alcohols such as methanol, ethanol, propanol and butanol; ketones such as acetone, methyl ethyl ketone, methyl isobutyl ketone, cylcohexanone, diisobutyl ketone, etc., esters such as ethyl acetate, butyl acetate, amyl acetate, methyl formate, ethyl propionate, dimethyl phthalate, ethyl benzoate and methyl Cellosolve acetate; aromatic hydrocarbons such as toluene, xylene, benzene, ethylbenzene; halogenated hydrocarbons such as carbon tetrachloride, trichloroethylene, chloroform, 1,1,1-trichloroethane, 1,2-dichloroethane, monochlorobenzene, chloronaphthalene; ethers such as tetrahydrofuran, diethyl ethers ethylene glycol monoethhyl ether acetate, ethylene glycol monomethyl ether, etc., diemethylformamide, dimethyl sulfoxide, etc., and mixtures thereof. The most preferred solvents are ethyleneglycol monomethylether, ethyleneglycol monoethylether and dimethyl formamide which dissolve the other components of the photographic coating. A suitable amount of the solvent which can be employed in the photopolymerizable composition of this invention ranges from about 200% to about 1,000%, preferably 50% to 500%, by weight of the total non-solvent parts of the composition. The prepared photo dielectric composition is then coated on the semi-transparent metal layer or on the base by well known techniques such as but not limited to spin coating, slot die coating, extruding, Meyer rod drawing, blade drawing, screen coating, curtain coating, dip coating, or spray coating. Once the photo dielectric composition is applied, the solvents are evaporated to yield a dry coating weight of from about 20 to about 200 $g/m^2$, more preferably from about 4 to about 150 $g/m^2$, and most preferably from about 50 to about 100 $g/m^2$. A protective film may optionally be attached to the photo dielectric composition until it is ready for use.

Referring now to FIG. 4, intermediate product 70 includes at least one embedded circuit 16. Embedded circuit 16 will typically be formed on the base 14. Embedded circuit 16 may be manufactured of any conductive metal, alloy, or any other material that is useful for circuits in a printed circuit board.

Figure 5A:
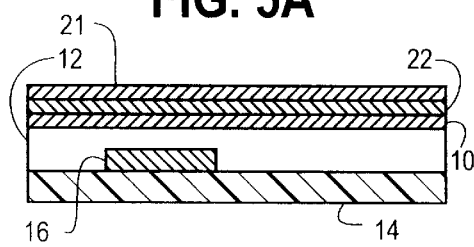
FIGS. 5A, 5B and 5C depict a cross-sectional illustration of a circuit board intermediate product during steps of a method for manufacturing interlayer vias in a circuit board.
Figure 5B:
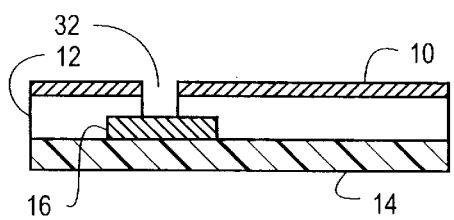
Figure 5C:
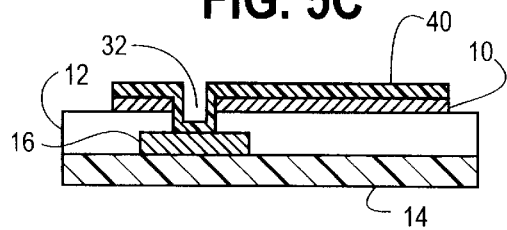

FIGS. 5A–5C depict a printed circuit board cross-section during stages of the metal in place photo-via manufacturing process. While FIGS. 5A–5C discloses an entire process, this invention encompasses intermediate products manufactured by one or more steps of the method depicted in FIG. 5. When a preferred laminate is used, the resulting starting structure, shown in FIG. 5, includes carrier film layer 21, release agent layer 22, semi-transparent metal layer 10, photo dielectric layer 12, base layer 14, and at least one embedded circuit 16.

In FIG. 5A, carrier film 21 is removed from the substrate to expose release agent layer 22 covering ultra thin metal layer 10. Release agent layer 22 can be removed by aid of a plasma, oxidizing environment, intense light, or preferably a solvent, and most preferably using an aqueous solvent system. Depending on the developer used in the later step to develop the vias, release agent layer 22 may be left on the metal layer through the exposure process. A photographic tool is placed in contact with ultra thin metal layer 10, (or in contact with the release layer if left on the metal layer) and the combination exposed by an actinic light source such that light passes through the tool and through the semi-transparent metal layer 10 into photo dielectric layer 12. In the case of negative acting photo dielectrics, the tool effectively blocks light passage to the via areas while permitting exposure to the surrounding areas, In the case of positive acting photo dielectrics, the tool is chosen such that the light passage is blocked to the surrounding areas and passes only to the point of via formation. The actinic light is applied to the substrate for a period of time sufficient for enough light to pass through semi-transparent metal layer to cure a portion of photo dielectric layer 12 in the case of negative acting chemistries, or to increase the photo dielectric solubility in the case of positive acting systems. The amount of time that the combination is subjected to the light source will depend upon several variables including the thickness and the type of metal used in the ultra thin metal layer, the actinic light intensity and light wavelength among others. It is expected that the substrate will be exposed to light source having wavelength within the ultraviolet region, from about 200 nm to about 450 nm, for a period of time ranging from several seconds to several minutes. The source wavelength is chosen to match the actinic characteristics of the photo dielectric.

The exposed photo dielectric with the ultra thin metal layer is developed by an appropriate solvent to resolve vias. The solvent permeates the semi-transparent metal layer which is porous to the solvent causing the underlying photo dielectric layer portion that is to be removed to swell. It has been found that the general turbulence of the solvating environment, and, more preferably, the addition of impinging jets to the environment solvate the photo dielectric under the metal layers and aid development and simultaneous removal of both the softened photo dielectric portion and the corresponding overlying semi-transparent metal layer. In the case where release agent layer 22 was not removed, the release layer could be removed in the developing process. Preferably, the preferred vias expose a portion of embedded circuit 16 associated with the substrate as shown in FIG. 5B. The ultra thin metal layer remains about the vias for seeding pattern plating or panel plating circuit formation.

As shown in FIG. 5C, a conductive interconnection 40 is then formed between embedded circuit 16 and ultra thin metal layer 10 to conductively link two circuit layers in the substrate and form circuit traces. Pattern plating or panel plating circuit forming techniques can be used to form FIG. 5C from FIG. 5B.

The method and articles of this invention can be used to manufacture vias and link circuits located on multiple layers in a printed circuit board. An example of manufacturing a multi-layered printed circuit board is found in U.S. Pat. No. 5,451,721 which is incorporated herein by reference.

The following nonlimiting examples are intended to be illustrative of several embodiments of the invention.

EXAMPLE 1

This Example determines the percent transmission of light having a wavelength of 355 nm through a sputtered gold foil. A UV spectrophotometer (HPA452A) was used to determine the percent transmission of light through the gold film manufactured using various gold sputtering times. The results of the light transmission tests are set forth in Table 1 below.

TABLE 1

| Sputtering Time | Thickness (Å) | Average % Light Transmission at 366 nm |
|---|---|---|
| 30 seconds | 500 | 66.5 |
| 60 seconds | 1000 | 48 |
| 90 seconds | 1500 | 35 |
| 120 seconds | 2000 | 26 |
| 150 seconds | 2500 | 19 |
| 180 seconds | 3000 | 13 |

The tabulated results show that some light is transmitted through very thin films of gold. However, the transmission light intensity quickly diminishes as the sputtering time (i.e. gold film thickness) increases.

EXAMPLE 2

An interlayer via was prepared according to a method of this invention. A release coating having the ingredients indicated in Table 2 was prepared.

TABLE 2

| Component | Source | Amount |
|---|---|---|
| Polyvinylpyrrolidone, PVP-K120 | ISP Technologies | 50.0 g |
| Surfactol 365 | CasChem | 0.25 g |
| Water | | 449.75 g |

A sample of 2 mil Upilex™ polyimide film was obtained from UBE Industries. The above release layer was coated on the film and dried at 160° C. for 2 minutes. The resulting coating measured 250 mg/ft$^2$. The coating was clear. A gold metal layer was sputtered on the clear coating using a Desk III sputtering units. Gold was deposited on the release layer for 60 seconds to a thickness of approximately 1000 Angstroms. A photodielectric negative acting film known as AE-15 was obtained from Morton Electronic Materials. The film dielectric was dissolved in a mixture of methyl ethyl ketone and cyclohexanone. The resulting solution was coated and dried on the metal layer. The layer construction was laminated using a roll laminator at 95° C. to an FR-4 laminate circuit board. The polyimide film was-easily peeled leaving the release layer on the metal surface. A photo-tool was placed over the release layer, and the stack exposed to a UV light source for 240 seconds. After removing the photo-tool, a pH 10–11 aqueous developer was applied to the surface for 8 minutes using jet application. During development the vias were revealed as well as removing the release layer from the laminate. Further circuit formation is performed using standard panel and pattern plating techniques known in the art.

EXAMPLE 3

An interlayer via was prepared according to a method of this invention. A release coating having the ingredients indicated in Table 3 was prepared.

TABLE 3

| Component | Source | Amount |
|---|---|---|
| Polyvinylpyrrolidone, PVP-K120 | ISP Technologies | 50.0 g |
| Surfactol 365 | CasChem | 0.25 g |
| Water | | 449.75 g |

A sample of 2 mil Upilex™ polyimide film was obtained from UBE Industries. The above release layer was coated on the film and dried at 160° C. for 2 minutes. The resulting coating measured 250 mg/ft². The coating was clear. A copper metal layer was sputtered on the clear coating to a thickness such that 55% of light from a UV light source was transmitted through the copper metal layer. A photodielectric negative acting film known as AE-15 was obtained from Morton Electronic Materials. The film material was first laminated to an FR-4 laminate circuit board. Afterwards, the layer construction was laminated using a roll laminator at 95° C. The polyimide film was easily peeled leaving the release layer on the metal surface. A photo-tool was placed over the release layer, and the stack exposed to a UV light source for 240 seconds. After removing the photo-tool, a pH 10–11 aqueous developer was applied to the surface for 8 minutes using jet application. During development the vias were revealed as well as removing the release layer. Further circuit formation of the copper film layer was performed using standard panel and pattern plating techniques known in the art.

What we claim is:

1. A method for manufacturing an interlayer via comprising the steps:
    (a) preparing a circuit board intermediate further comprising: (1) a substrate; (2) a photo dielectric layer deposited on the substrate; (3) an semi-transparent metal layer deposited on the photo dielectric layer; and (4) at least one embedded circuit;
    (b) exposing at least a portion of the circuit board intermediate to light through the semi-transparent metal layer for a period of time sufficient to form an exposed photo dielectric portion;
    (c) removing the exposed portion of the photo dielectric layer and a corresponding portion of the semi-transparent metal layer overlying the exposed portion of the photo dielectric layer to form a via.

2. The method of claim 1 wherein the embedded circuit is exposed by the via.

3. The method of claim 2, further including the step of applying a conductive interconnect that conductively unites the embedded circuit and the semi-transparent metal layer.

4. The method of claim 3, further including the step of etching and plating a circuit on at least a portion of the semi-transparent metal layer to form a multilayer printed circuit board.

5. A method for manufacturing an interlayer via comprising the steps:
    (a) preparing a circuit board intermediate further comprising: (1) a substrate; (2) a photo dielectric layer deposited on the substrate; (3) an semi-transparent metal layer deposited on the photo dielectric layer; and (4) at least one embedded circuit;
    (b) exposing at least a portion of the circuit board intermediate to light through the semi-transparent metal layer for a period of time sufficient to form an exposed photo dielectric portion;
    (c) removing an unexposed portion of the photo dielectric layer and a corresponding portion of the semi-transparent metal layer overlying the unexposed portion of the photo dielectric layer to form a via.

6. The method of claim 5 wherein the embedded circuit is exposed by the via.

7. The method of claim 6, further including the step of applying a conductive interconnect that conductively unites the embedded circuit and the semi-transparent metal layer.

8. The method of claim 7, further including the step of etching and plating a circuit on at least a portion of the semi-transparent metal layer to form a multilayer printed circuit board.

* * * * *